(12) United States Patent
Chuang et al.

(10) Patent No.: US 12,284,814 B2
(45) Date of Patent: *Apr. 22, 2025

(54) SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Harry-Hak-Lay Chuang, Paya Lebar Crescent (SG); Sheng-Huang Huang, Hsinchu (TW); Keng-Ming Kuo, Yunlin County (TW); Hung Cho Wang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/338,509

(22) Filed: Jun. 21, 2023

(65) Prior Publication Data
US 2023/0345739 A1    Oct. 26, 2023

Related U.S. Application Data

(60) Continuation of application No. 17/244,768, filed on Apr. 29, 2021, now Pat. No. 11,723,219, which is a division of application No. 16/884,883, filed on May 27, 2020, now Pat. No. 10,998,377, which is a division of application No. 15/962,434, filed on Apr. 25, 2018, now Pat. No. 10,727,272.

(60) Provisional application No. 62/590,465, filed on Nov. 24, 2017.

(51) Int. Cl.
| | | |
|---|---|---|
| H10B 61/00 | (2023.01) | |
| H10N 50/01 | (2023.01) | |
| H10N 50/10 | (2023.01) | |
| H10N 50/80 | (2023.01) | |

(52) U.S. Cl.
CPC .............. *H10B 61/22* (2023.02); *H10N 50/01* (2023.02); *H10N 50/10* (2023.02); *H10N 50/80* (2023.02)

(58) Field of Classification Search
CPC ....... H01L 27/228; H01L 43/02; H01L 43/08; H01L 43/12; H01L 27/222; H10B 61/22; H10B 61/00; H10N 50/01; H10N 50/10; H10N 50/80
See application file for complete search history.

(56) References Cited

U.S. PATENT DOCUMENTS 9,502,466 B1 * 11/2016 Chuang ................ H10N 70/841
2018/0211995 A1 * 7/2018 Bak ........................ H10N 50/01

* cited by examiner

*Primary Examiner* — Cuong B Nguyen
(74) *Attorney, Agent, or Firm* — WPAT LAW; Anthony King

(57) ABSTRACT

The present disclosure provides a semiconductor structure, including a memory region, a logic region adjacent to the memory region, a first magnetic tunneling junction (MTJ) cell and a second MTJ cell over the memory region, and a carbon-based layer over the memory region, wherein the carbon-based layer includes a recess between the first MTJ cell and the second MTJ cell.

20 Claims, 17 Drawing Sheets

SEMICONDUCTOR STRUCTURE AND MANUFACTURING METHOD OF THE SAME

CROSS REFERENCE TO RELATED APPLICATIONS

This application claims the benefit of the prior-filed U.S. non-provisional application Ser. No. 17/244,768 filed on Apr. 29, 2021, the prior-filed U.S. non-provisional application Ser. No. 16/884,883 filed on May 27, 2020, the prior-filed U.S. non-provisional application Ser. No. 15/962,434 filed on Apr. 25, 2018, and the prior-filed provisional application No. 62/590,465, filed on Nov. 24, 2017.

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device.

MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer. Pinned layer has a fixed magnetization direction. When current flows in the direction from free layer to pinned layer, electrons flow in a reverse direction, that is, from pinned layer to free layer. The electrons are polarized to the same magnetization direction of pinned layer after passing pinned layer; flowing through tunnel layer; and then into and accumulating in free layer. Eventually, the magnetization of free layer is parallel to that of pinned layer, and MTJ device will be at a low resistance state. The electron injection caused by current is referred to as a major injection.

When current flowing from pinned layer to free layer is applied, electrons flow in the direction from free layer to pinned layer. The electrons having the same polarization as the magnetization direction of pinned layer are able to flow through tunnel layer and into pinned layer. Conversely, electrons with polarization differing from the magnetization of pinned layer will be reflected (blocked) by pinned layer and will accumulate in free layer. Eventually, magnetization of free layer becomes anti-parallel to that of pinned layer, and MTJ device will be at a high resistance state. The respective electron injection caused by current is referred to as a minor injection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
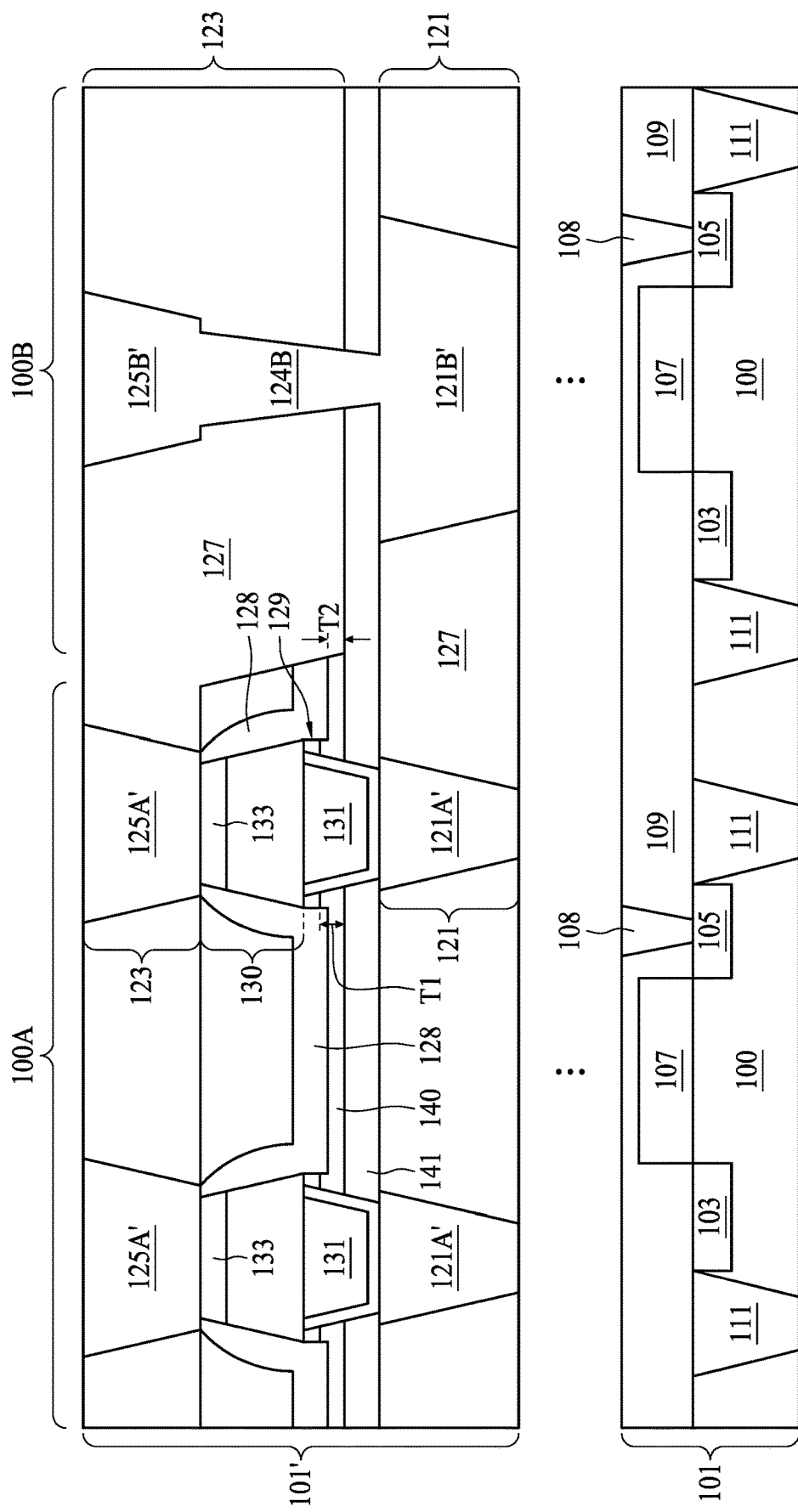
FIG. 1 is a cross section of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embedded MRAM cell in a CMOS structure has been continuously developed. A semiconductor circuit with embedded MRAM cell includes an MRAM cell region and a logic region separated from the MRAM cell region. For example, the MRAM cell region may locate at the center of the aforesaid semiconductor circuit while the logic region may locate at a periphery of the semiconductor circuit. Note the previous statement is not intended to be limiting. Other arrangement regarding the MRAM cell region and the logic region are enclosed in the contemplated scope of the present disclosure.

In the MRAM cell region, a transistor structure can be disposed under the MRAM structure. In some embodiments, the MRAM cell is embedded in the metallization layer prepared in a back-end-of-line (BEOL) operation. For example, the transistor structures in the MRAM cell region and in the logic region are disposed in a common semiconductor substrate, prepared in a front-end-of-line operation, and are substantially identical in the aforesaid two regions in some embodiments. Conventionally, the MRAM cell is embedded between adjacent metal line layers distributed horizontally parallel to a surface of the semiconductor substrate. For instance, the embedded MRAM can be located between the $4^{th}$ metal line layer and the $5^{th}$ metal line layer in an MRAM cell region. Horizontally shifted to the logic region, the $4^{th}$ metal line layer is connected to the $5^{th}$ metal line layer though a $4^{th}$ metal via. In other words, taking the MRAM cell region and the logic region into consideration, the embedded MRAM occupies a thickness of at least the $4^{th}$ metal via. The number provided for the metal line layer herein is not limiting. In general, people having ordinary skill in the art can understand that the MRAM is located between an $N^{th}$ metal line layer and an $(N+1)^{th}$ metal line layer, where N is an integer greater than or equal to 1.

The embedded MRAM includes a magnetic tunneling junction (MTJ) composed of ferromagnetic materials. A bottom electrode and a top electrode are electrically coupled to the MTJ for signal/bias conveyance. Following the example previously provided, the bottom electrode is further connected to the $N^{th}$ metal line layer, whereas the top electrode is further connected to the $(N+1)^{th}$ metal line layer.

As the CMOS technology node goes down, the thickness of the inter-metal dielectric (IMD) in the back-end-of-line (BEOL) continues to scale down and become significantly thin in technology node N16 and beyond. However, due to processing barrier, the thickness of the MTJ cannot be reduced accordingly, rendering embedded MRAM no longer fitted in the conventional embedding scheme. For example, an average thickness of the MTJ stack (including the upper electrode, the lower electrode, and the MTJ layer sandwiched there between) is about 1000 Å. In technology node N40, the IMD thickness between two adjacent metal line layers is over 1200 Å (here the IMD thickness is referred to a space height between the $4^{th}$ metal line layer and the $5^{th}$ metal line layer), MTJ stack can be embedded in the memory region of the N40 embedded MRAM circuit.

Patterning MTJ cells from MTJ multilayer is a crucial operation in MRAM manufacturing which dictates the memory device performance. Conventionally, reactive ion etch (RIE) or inductive coupled plasma (ICP) RIE has been used to pattern the MTJ cells from MTJ multiplayer. However, due to the fact that RIE or ICP-RIE both include chemical reaction in the etching operation, sidewall of the patterned MTJ cell may be coated with products or byproducts of the chemical reaction, causing MTJ short, low tunnel magnetoresistance (TMR) ratio, or low hoercivity (Hc). Physical bombardment patterning such as ion beam etch (IBE) is an alternative to RIE or ICP-RIE in order to resolve the chemical residue at the sidewall of the MTJ cells. IBE has little to none selectivity to interlayer dielectric (ILD) covering the interconnects in the back-end-of-line (BEOL) or mid-end-of-line (MEOL) operation stages. Therefore, adopting IBE to pattern MTJ cells from MTJ multilayer can cause damage to the ILD as well as the interconnects underneath the ILD, leading to input/output short. Particularly, the ILD and interconnects damage can take place at the regions without hard masking, for example, at the memory region between adjacent MTJ cells, or at the logic region.

The present disclosure provides a semiconductor structure having a memory region. The memory region includes an $N^{th}$ metal line, a MTJ cell over the $N^{th}$ metal line, a carbon-based layer over between the MTJ cell and the $N^{th}$ metal line. The carbon-based layer is configured to be an etch stop in both the memory region and the logic region, preventing IBE from damaging the region between adjacent MTJ cells as well as the interconnect in the logic region.

Referring to FIG. 1, FIG. 1 is a cross section of a semiconductor structure 10, in accordance with some embodiments of the present disclosure. The semiconductor structure 10 can be a semiconductor circuit including a memory region 100A and a logic region 100B. Each of the memory region 100A and the logic region 100B has a transistor structure 101 in a semiconductor substrate 100. In some embodiments, the transistor structures 101 are substantially identical in the memory region 100A and in the logic region 100B. In some embodiments, the semiconductor substrate 100 may be but is not limited to, for example, a silicon substrate. In an embodiment, substrate 100 is a semiconductor substrate, such as a silicon substrate, although it may include other semiconductor materials, such as silicon germanium, silicon carbide, gallium arsenide, or the like. In the present embodiment, the semiconductor substrate 100 is a p-type semiconductor substrate (P-Substrate) or an n-type semiconductor substrate (N-Substrate) comprising silicon. Alternatively, the substrate 100 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 100 is a semiconductor on insulator (SOI). In other alternatives, semiconductor substrate 100 may include a doped epi layer, a gradient semiconductor layer, and/or a semiconductor layer overlying another semiconductor layer of a different type, such as a silicon layer on a silicon germanium layer. The semiconductor substrate 100 may or may not include doped regions, such as a p-well, an n-well, or combination thereof.

The semiconductor substrate 100 further includes heavily doped regions such as sources 103 and drains 105 at least partially in the semiconductor substrate 100. A gate 107 is positioned over a top surface of the semiconductor substrate 100 and between the source 103 and the drain 107. Contact plugs 108 are formed in inter-layer dielectric (ILD) 109, and may be electrically coupled to the transistor structure 101. In some embodiments, the ILD 109 is formed on the semiconductor substrate 100. The ILD 109 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 109 above the semiconductor substrate 100 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

FIG. 1 shows a planar transistor having a doped region in the semiconductor substrate 100. However, the present disclosure is not limited thereto. Any non-planar transistor, such as a FinFET structure, can have raised doped regions.

In some embodiments, a shallow trench isolation (STI) 111 is provided to define and electrically isolate adjacent transistors. A number of STI 111 are formed in the semiconductor substrate 100. The STI 111, which may be formed of suitable dielectric materials, may be provided to isolate a transistor electrically from neighboring semiconductor devices such as other transistors. The STI 111 may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The STI 111 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the STI 111 may also be formed of any suitable "low dielectric constant" or "low K" dielectric material, where K is less than or equal to about 4.

Referring to FIG. 1, a metallization structure 101' is disposed above the transistor structure 101. Because the $N^{th}$ metal line 121A' of the $N^{th}$ metal layer 121 may not be the first metal layer over the transistor structure 101, the omission of a portion of the metallization structure 101' is represented by dots. In the memory region 100A, an MTJ cell 130 is disposed between an $N^{th}$ metal layer 121 and an $(N+1)^{th}$ metal layer 123. In some embodiments, an MTJ cell 130 is disposed between an $N^{th}$ metal line 121A' of the $N^{th}$ metal layer 121 and an $(N+1)^{th}$ metal line 125A' of the $(N+1)^{th}$ metal layer 123, whereas in the logic region 100B, the $N^{th}$ metal line 121B' is connected to the $(N+1)^{th}$ metal via 124B. In the present disclosure, the MTJ cell 130 includes patterned MTJ multilayer and the top electrode but excluding the bottom electrode via 131. In some embodiments, the metal lines and metal vias are filled with electrically conductive material, e.g. copper, gold or another suitable metal or alloy, to form a number of conductive vias. Metal lines and metal vias in different metal layers form an interconnect structure composed of substantially pure copper (for example, with a weight percentage of copper being greater than about 90 percent, or greater than about 95 percent) or copper alloys, and may be formed using the single and/or dual damascene processes. Metal lines and metal vias may be, or may not be, substantially free from aluminum. Interconnect structure includes a plurality of metal layers, namely $M_1, M_2 \ldots M_N$. Throughout the description, the term "metal layer" refers to the collection of the metal lines in the same layer. In some embodiments, the upper metal layer may not be $(N+1)^{th}$ metal layer 123 but includes $(N+M)^{th}$ metal layer where M is also a positive integer greater than 1. Depending on different technology nodes, the MTJ cell 130 and the bottom electrode via 131 may occupy a thickness more than one metal layer.

Metal layers $M_1$ through $M_N$ are formed in inter-metal dielectrics (IMDs) 127, which may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 127 may also be close to 3.8. In some embodiments, the k values of the low-k dielectric materials are lower than about 3.0, and may be lower than about 2.5. The metal vias and metal lines may be formed by a variety of techniques, e.g., electroplating, electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Figure 2:
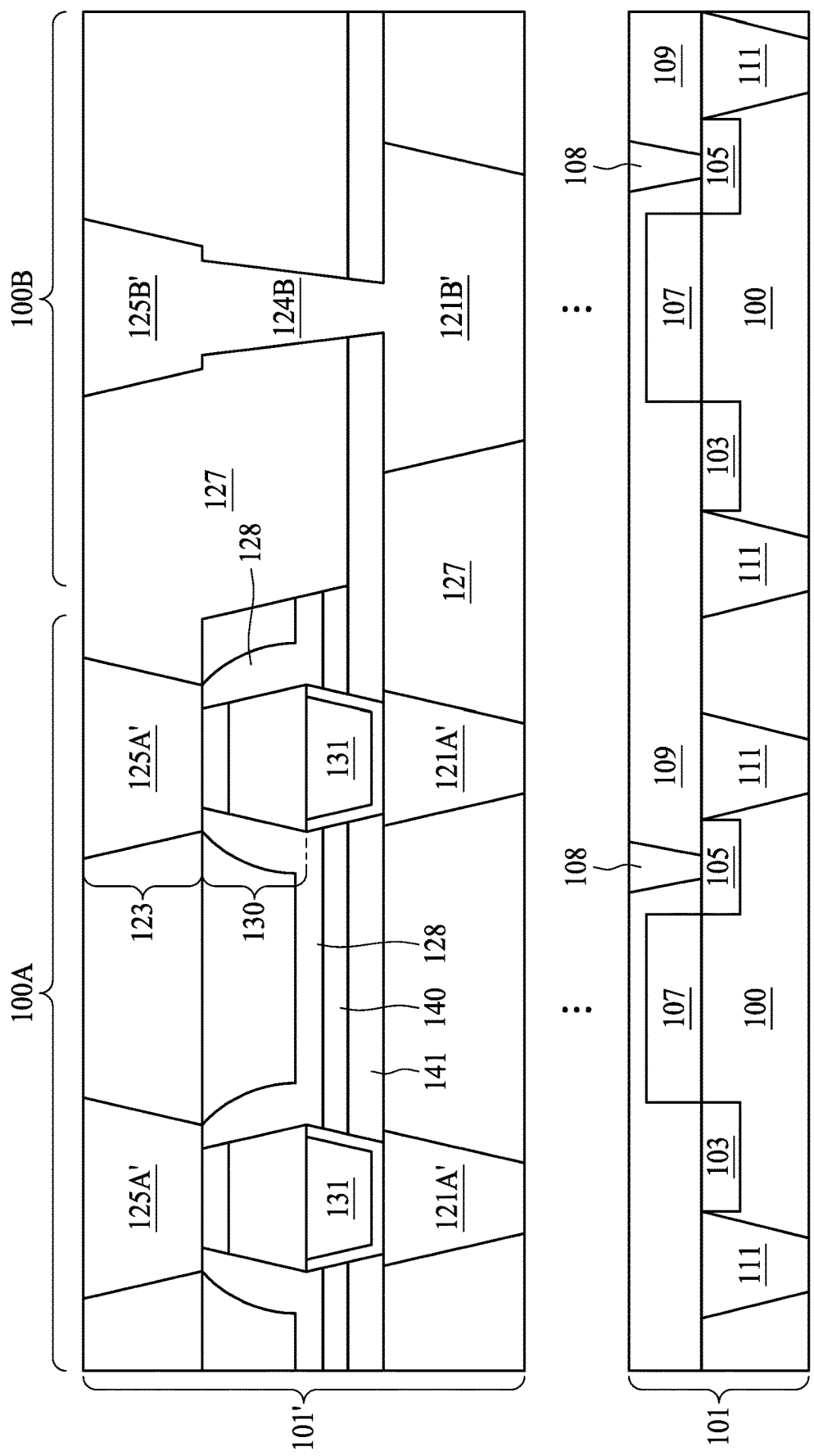
FIG. 2 is a cross section of a semiconductor structure, in accordance with some embodiments of the present disclosure.

In some embodiments, the bottom electrode via 131 possesses a trapezoidal recess in a composite layer and at least surrounded by an interlayer dielectric (ILD) 141, a carbon-based layer 140, and a sidewall spacer 128. In some embodiments, residue of a planarization etch stop layer 129 surrounds the bottom electrode via 131 and is shadowed by the above MTJ cell 130. As shown in FIG. 1, the ILD 141 interfaces with the underlying IMD 127 and the $N^{th}$ metal layer 121, the carbon-based layer 140 stacked over the ILD 141, and the sidewall spacer 128 stacked over the carbon-based layer 140. In some embodiments when the width of the MTJ cell 130 is wider than illustrated, the residue of a planarization etch stop layer 129 may also be wider due to the masking effect contributed by the MTJ cell 130. In the contrary, when the width of the MTJ cell 130 is narrower, as shown in FIG. 2, there may be no residue of the planarization etch stop layer 129 under the MTJ cell.

Figure 3:
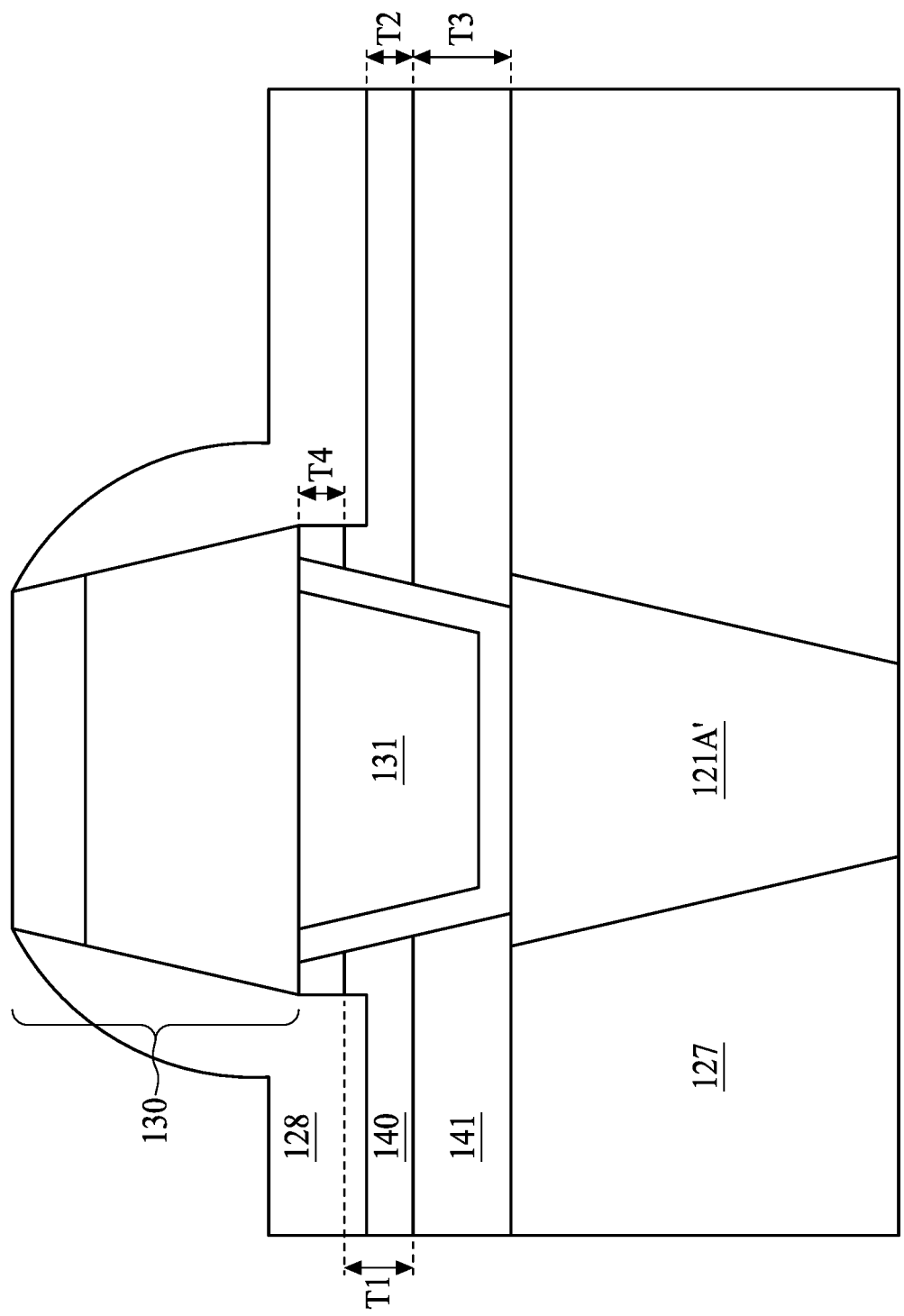
FIG. 3 is an enlarged view of a portion of a cross section of a semiconductor structure, in accordance with some embodiments of the present disclosure.

As shown in FIG. 1 and FIG. 3, a portion of the carbon-based layer 140 under the residue of the planarization etch stop layer 129 possesses a thickness T1 greater than the thickness T2 of a portion of the carbon-based layer 140 away from or not shadowed by the residue of the planarization etch stop layer 129. This shows that the carbon-based layer 140 can still be consumed by the ion beam etch but in a sufficient low rate so that the underlying ILD 141 will not be damaged by this physical etch. In some embodiments, the thickness T1 is close to an as-deposited carbon-based layer 140 and is about 200 to 300 Angstrom. The thickness T2 is thinner than T1 due to the ion beam removal and is about 30 to 100 Angstrom in order to effectively prevent the damage to ILD 141.

Note the carbon-based layer 140 only appear in the memory region 100A and is absent from the logic region 100B due to an operation removing the carbon-based layer 140 from the logic region 100B prior to the formation of the $(N+1)^{th}$ metal layer 123 in the memory region 100A and the logic region 100B.

As shown in FIG. 1 and FIG. 3, in some embodiments, the interlayer dielectric 141 includes silicon carbide, configured to be an etch stop preventing damage from the $N^{th}$ metal layer 121B' when removing the IMD 127 over the $N^{th}$ metal layer 121B' in the logic region 100B. For example, a thickness T3 of the ILD 141 is in a range of from about 250 to 300 Angstrom in order to effectively stop the IMD removal etch. In some embodiments, silicon carbide can be considered as the carbon-based layer of the present disclosure. As shown in FIG. 1, in order to function as an etch stop layer for the IBE, the ILD 141 and the carbon-based layer 140 can be composed of silicon carbide by having their respective thicknesses as previously discussed in FIG. 3.

As shown in FIG. 1 and FIG. 3, in some embodiments, the carbon-based layer 140 includes amorphous carbon, carbon, and diamond. Carbon-based layer 140 may include single compound or carbon-based composite materials. In some embodiments, carbon-based layer 140 may include SiC, carbon cluster, carbon black, and advanced pattern film which includes carbon. As previously discussed, the carbon-based layer 140 is configured as an etch stop layer for an ion beam etch. A selectivity between the planarization etch stop layer 129 and the carbon-based layer 140, in some embodiments, is greater than 3:1.

As shown in FIG. 1 and FIG. 3, in some embodiments, the planarization etch stop layer 129 can be formed by silicon-rich oxides (SRO) and function as an etch stop layer when performing a planarization operation after the formation of the bottom electrode via 131 and prior to the deposition of MTJ multilayer. For example, a thickness T4 of the planarization etch stop layer 129 is close to the as-deposited planarization etch stop layer 129 and is similar to the thickness T3 of the ILD 141.

In some embodiments, the bottom electrode via 131 may include metal nitrides. In some embodiments, the top electrode 133 may include metal nitrides or tantalum (Ta), titanium nitride (TiN). Materials constituting the bottom electrode via 131 and the top electrode 133 may or may not be identical. In some embodiments, the bottom electrode may compose more than one material and form a material stack. In some embodiments, the bottom electrode includes TiN, TaN, W, Al, Ni, Co, Cu, or combinations thereof. As shown in FIG. 1, the bottom electrode via 131 is electrically coupling to the first $N^{th}$ metal line 121A'.

Figure 4:
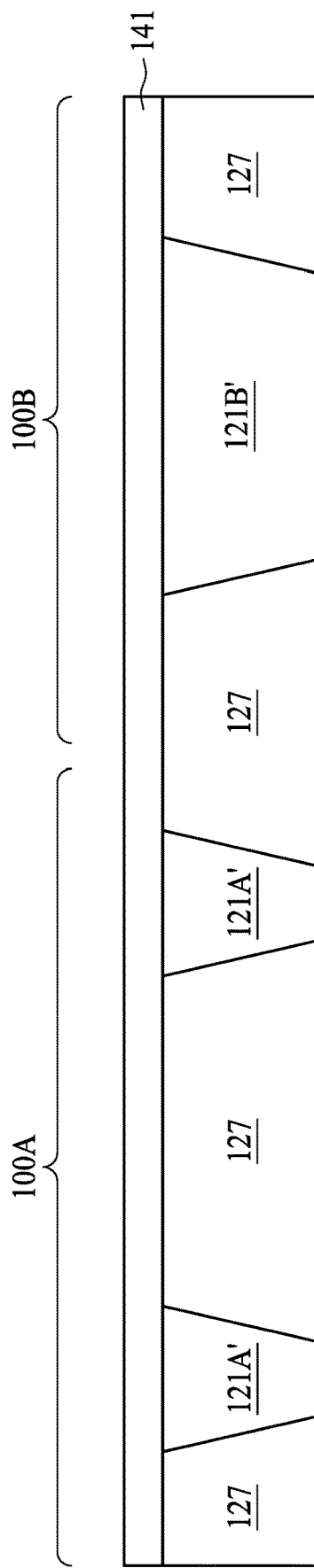
FIG. 4 to FIG. 17 are cross sections of a semiconductor structure fabricated at various stages, in accordance with some embodiments of the present disclosure.

FIG. 4 to FIG. 18 are cross sections of a semiconductor structure fabricated at various stages, in accordance with some embodiments of the present disclosure. In FIG. 4, $N^{th}$ metal line 121A' in the memory region 100A and $N^{th}$ metal line 121B' in the logic region 100B are formed. In some embodiments, the metal lines referred herein are composed of substantially pure copper (for example, with a weight percentage of copper being greater than about 90 percent, or greater than about 95 percent) or copper alloys, and may be formed using the conventional Damascene processes. Metal lines may be, or may not be, substantially free from aluminum. After planarization of the $N^{th}$ metal layer, the ILD 141 is deposited over the planarized surface with a thickness of from about 200 to 300 Angstrom in the memory region 100A and the logic region 100B. The ILD 141 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 141 above the $N^{th}$ metal layer 121 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

Figure 5:
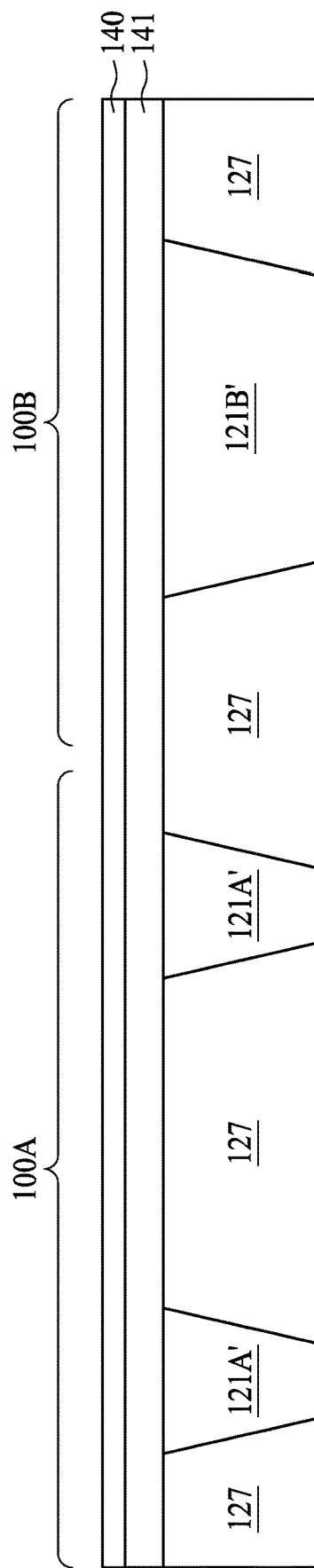

In FIG. 5, the carbon-based layer 140 is blanket deposited over the ILD 141 in the memory region 100A and the logic region 100B. As previously discussed, the carbon-based layer 140 can be composed of carbon, amorphous carbon, or diamond. In some embodiments, the carbon-based layer 140 includes SiC. In some embodiments, the carbon-based layer 140 includes carbon-containing composite materials such as carbon black. The as-deposited thickness of the carbon-based layer 140 is in a range of from 200 to 300 Angstrom, preserving half of the thickness for resisting the subsequent ion beam etching. The carbon-based layer 140 can be formed by a variety of techniques for forming such layers, e.g., chemical vapor deposition (CVD), low-pressure CVD (LPCVD), plasma-enhanced CVD (PECVD), inductively coupled plasma chemical vapor deposition (ICP CVD), high-density ionized metal plasma (IMP), sputter deposition, atomic layer deposition, physical vapor deposition (PVD), thermal growing, or the like.

Figure 6:
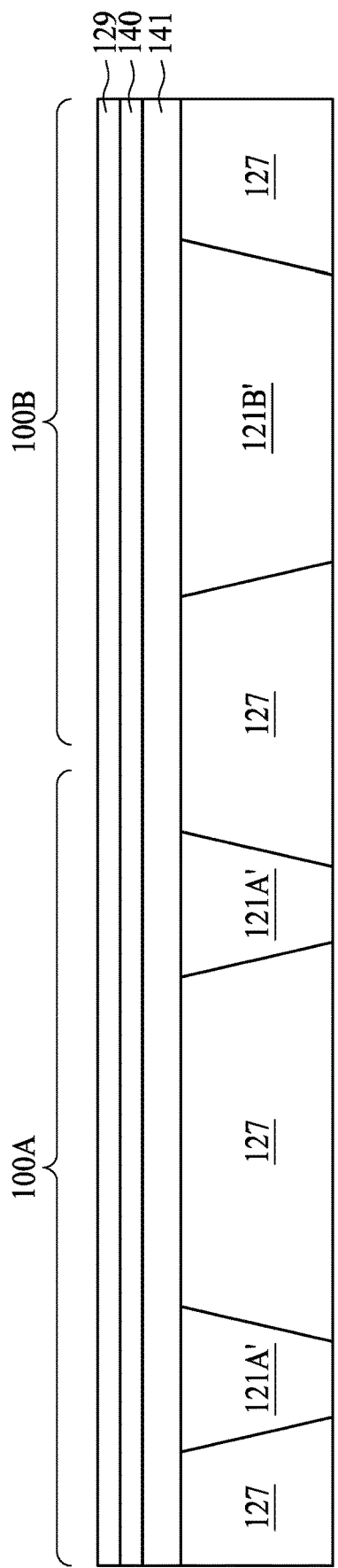

In FIG. 6, the planarization etch stop layer 129 is blanket deposited over the carbon-based layer 140 in the memory region 100A and the logic region 100B. As previously discussed, the planarization etch stop layer 129 may include silicon rich oxide or silicon carbide in an end point detection etch. In some embodiments, the as-deposited thickness of the planarization etch stop layer 129 can be in a range of from 200 to 300 Angstrom. The planarization etch stop layer 129 can be formed by a variety of techniques for forming such layers, e.g., chemical vapor deposition (CVD), low-pressure CVD (LPCVD), plasma-enhanced CVD (PECVD), inductively coupled plasma chemical vapor deposition (ICP CVD), high-density ionized metal plasma (IMP), sputter deposition, atomic layer deposition, physical vapor deposition (PVD), thermal growing, or the like.

Figure 7:
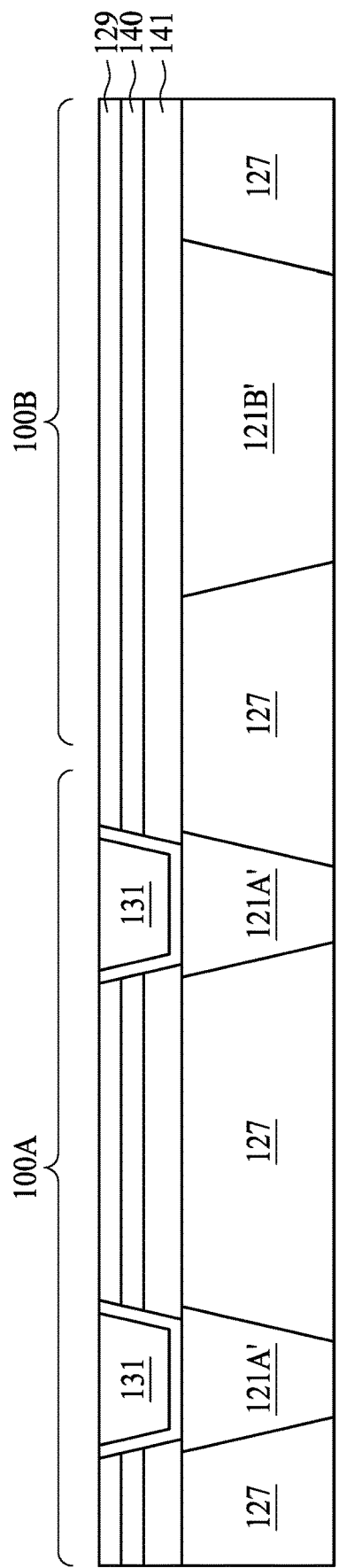

In FIG. 7, the bottom electrode via 131 is formed by first forming a bottom electrode via trench in the multilayer—the ILD 141, the carbon-based layer 140, and the planarization etch stop layer 128. The formation of the bottom electrode via trench can be implemented by any suitable etching operations that removes the aforesaid multilayer, in sequential etch or in one etch. The bottom electrode via trench is then filled with conductive materials to form bottom electrode via 131. In some embodiments, the conductive materials may include metal or metal nitrides. The bottom electrode via 131 may include TiN, TaN, W, Al, Ni, Co, Cu or the combination thereof.

Figure 8:
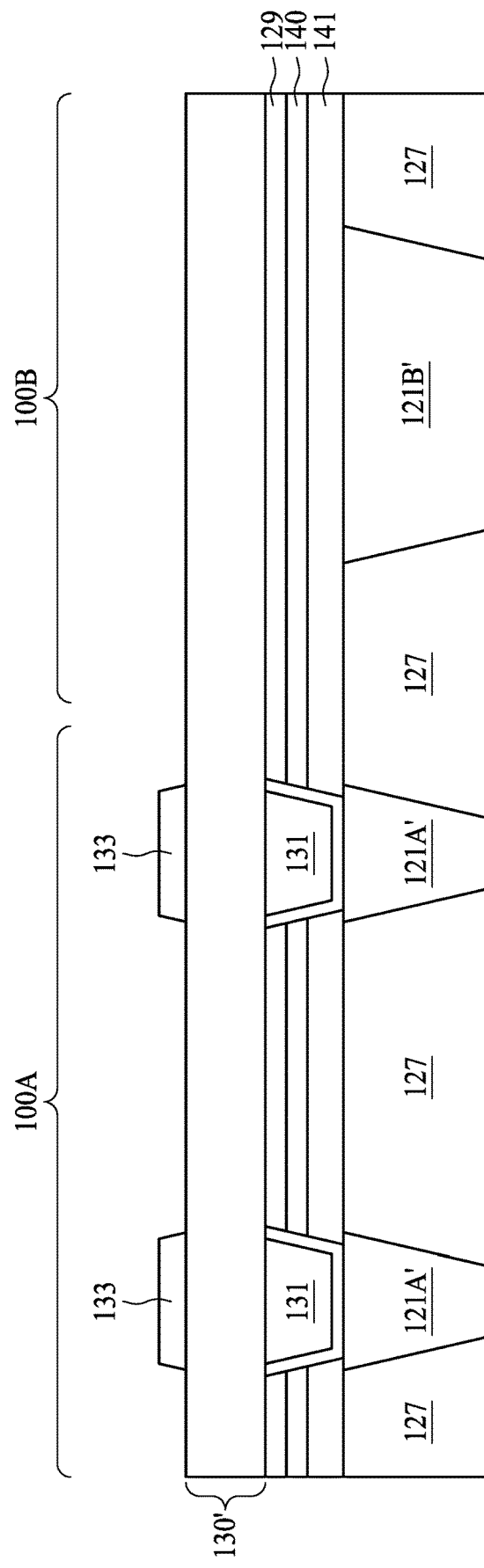

In FIG. 8, the MTJ multilayer 130' is deposited over the planarized surface composed of the bottom electrode via 131 and the planarization etch stop layer 129. In order to pattern the MTJ multilayer 130' to have desired MTJ cell array, a hard mask or a top electrode 133 pattern is formed over the MTJ multilayer 130' with a desirable width and pitch. In some embodiments, the hard mask 133 can be composed of the same material as the carbon-based layer 140 due to the fact that they are both utilized to resist the ion beam etching. In some embodiments, the hard mask 133 can be composed of top electrode materials which include tantalum (Ta), titanium nitride (TiN), tantalum nitride (TaN), or combinations thereof.

Figure 9:
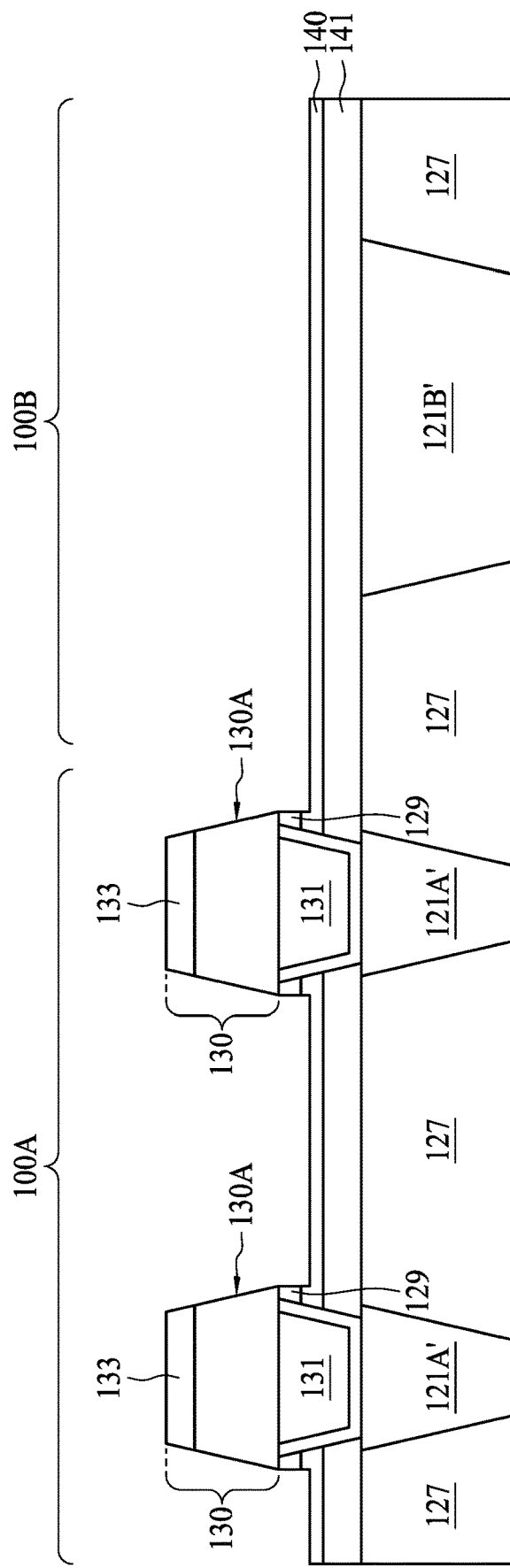

As shown in FIG. 9, the MTJ cell 130 is patterned in the memory region 100A by implementing a physical etch, for instance, an ion beam etch (IBE) in order to reduce the chemical product or byproduct absorbing on the sidewall 130A of the as-patterned MTJ cell 130. During the IBE operation, the MTJ multilayer 130', the planarization etch stop layer 129, and a portion of the carbon-based layer 140 are removed. In some embodiments, the selectivity of the planarization etch stop layer 129 to the carbon-based layer 140 during the IBE operation is greater than 3 to 1. The thickness of the carbon-based layer 140 is thick enough to prevent the IBE from damaging the underlying ILD 141 as well as the $N^{th}$ metal layer 131. In some embodiments, residue of the planarization etch stop layer 129 remains nearby the bottom electrode via 131 due to the shadowing of the MTJ cell 130. As previously discussed, the MTJ cell 130 functions as a hard mask to the planarization etch stop layer 129 during the IBE operation and thus when the MTJ cell 130 is wider than that of the bottom electrode via 131, planarization etch stop layer 129 would not be removed completely and can be observed in proximity to the bottom electrode via 131. Also discussed previously, thickness T1 of the carbon-based layer under the residue of the planarization etch stop layer 129 is thicker than thickness T2 of the carbon-based layer not shadowed by the MTJ cell 130. After the MTJ cell patterning operation, the carbon-based layer 130 still remain in both the memory region 100A and the logic region 100B.

Figure 10:
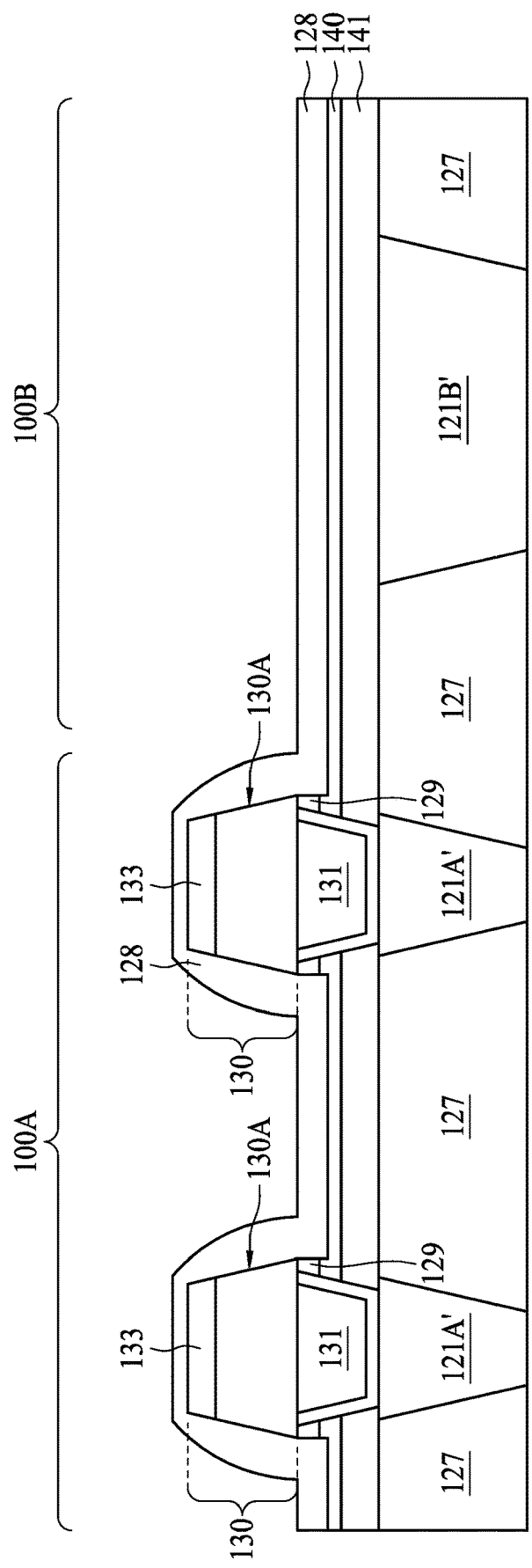

In FIG. 10, a sidewall spacer 128 is blanket deposited over the MTJ cell 130 and the carbon-based layer 130 in the memory region 100A and the logic region 100B. The sidewall spacer 128 covers the top of the hard mask 133, the sidewall 130A of the MTJ cell 130, and the top surface of the carbon-based layer 140.

Figure 11:
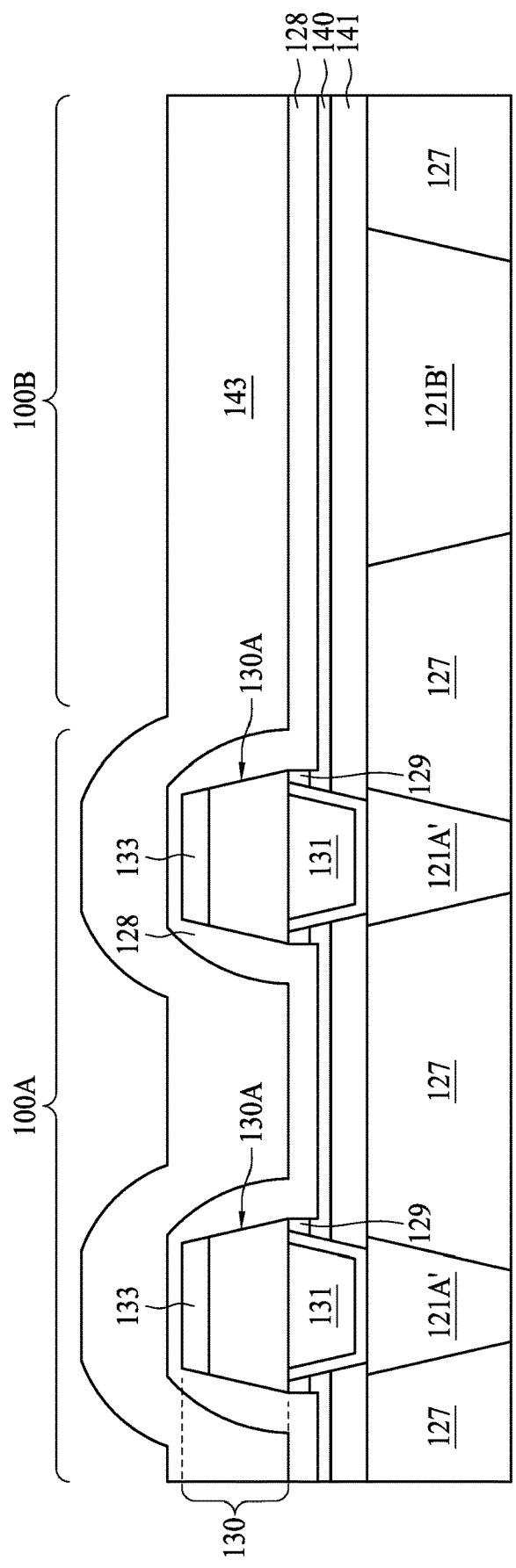
Figure 12:
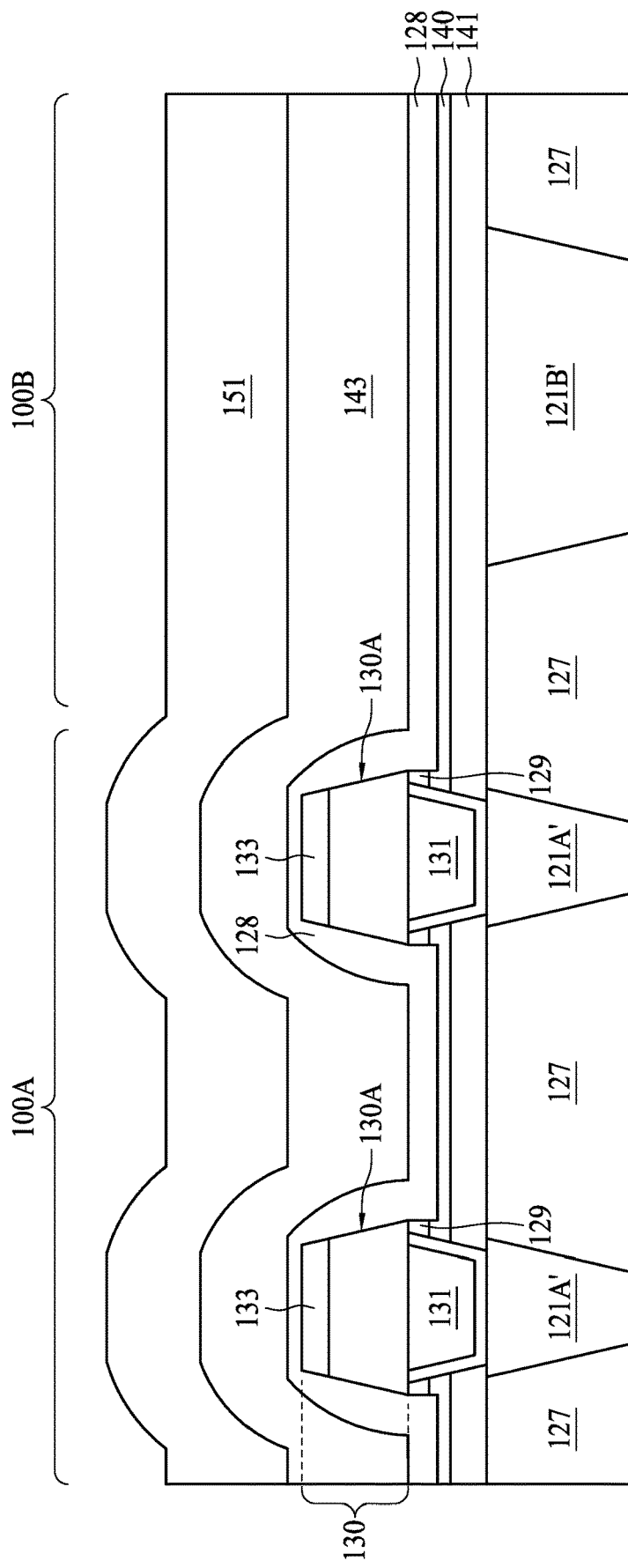
Figure 13:
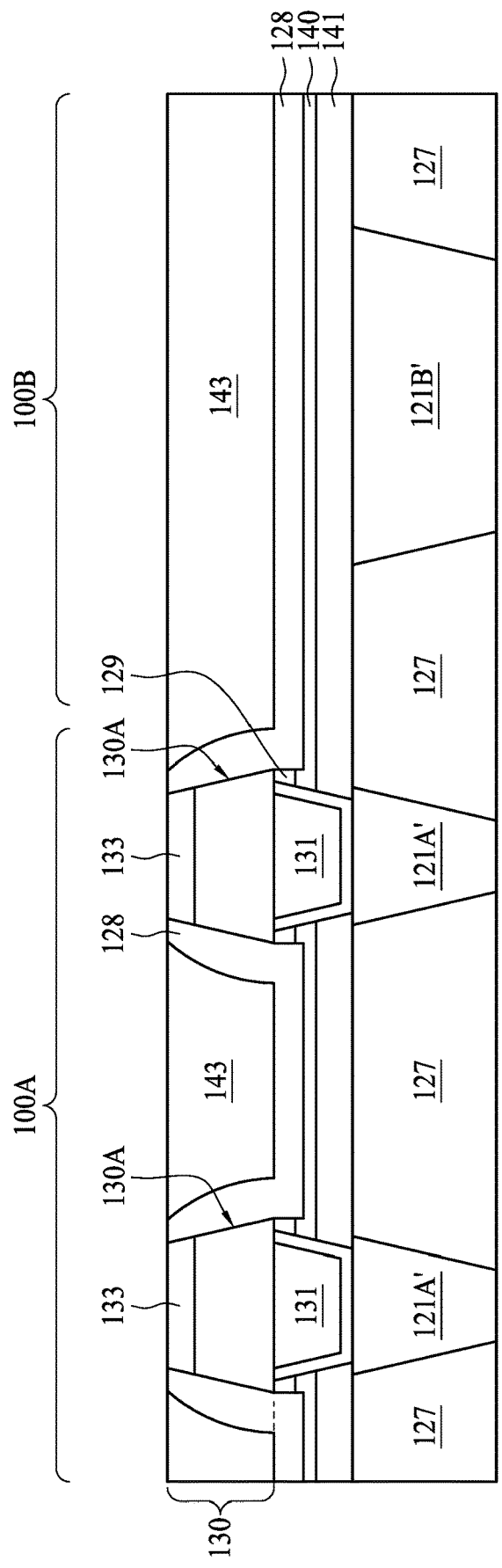

In FIG. 11, a dielectric layer 143 such as a TEOS layer is conformably deposited over the sidewall spacer 128, extending from the memory region 100A to the logic region 100B. In FIG. 12, an anti-reflective coating (ARC) 151 is formed over the dielectric layer 143, also extending from the memory region 100A to the logic region 100B. In some embodiments, in order to expose a top surface of the top electrode 133, an ARC etch back is performed with an end point detection approach, and the result is illustrated in FIG. 13 where the top surface of the top electrode 133 is exposed. In some embodiments, the top surface of the top electrode 133 is not exposed after the ARC etch back but rather capped by the sidewall spacer 128.

Figure 14:
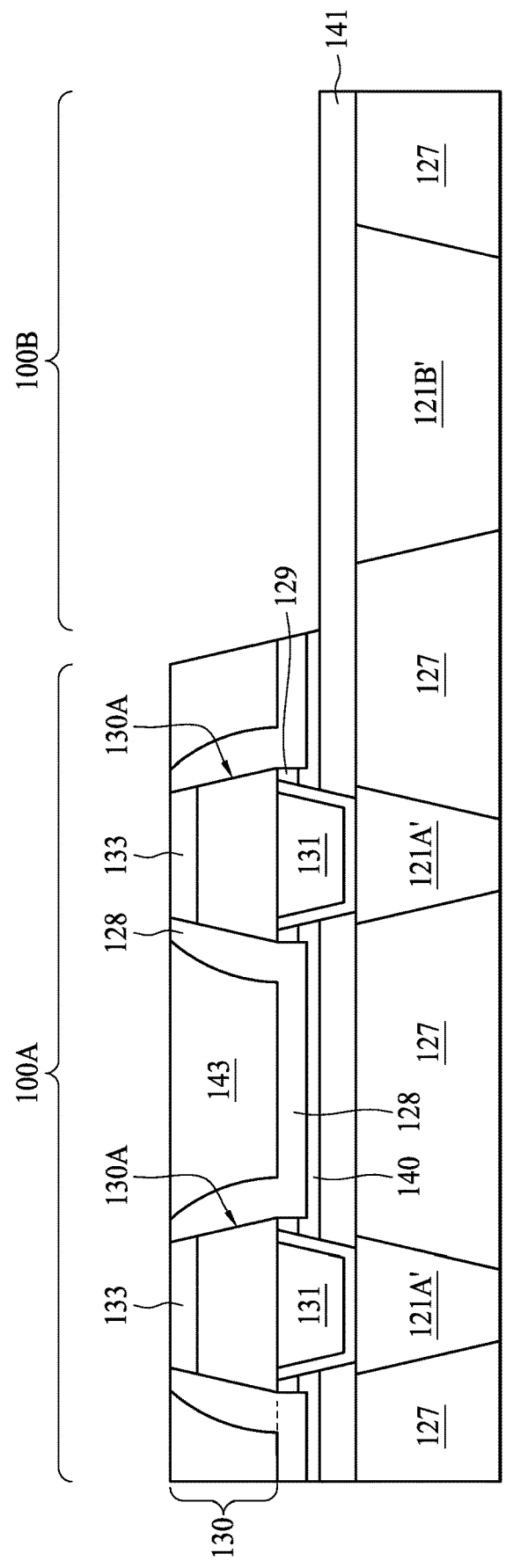

In FIG. 14, after etching back the ARC 151 and exposes the top surface of the top electrode 133, the dielectric layer 143, the sidewall spacer 128, and the carbon-based layer 140 are removed from the logic region 100B while the dielectric layer 143, the sidewall spacer 128, and the carbon-based layer 140 in the memory region 100A are still remained, in order to facilitate subsequent $(N+M)^{th}$ metal layer formation 123 in the logic region 100B and the memory region 100A.

Figure 15:
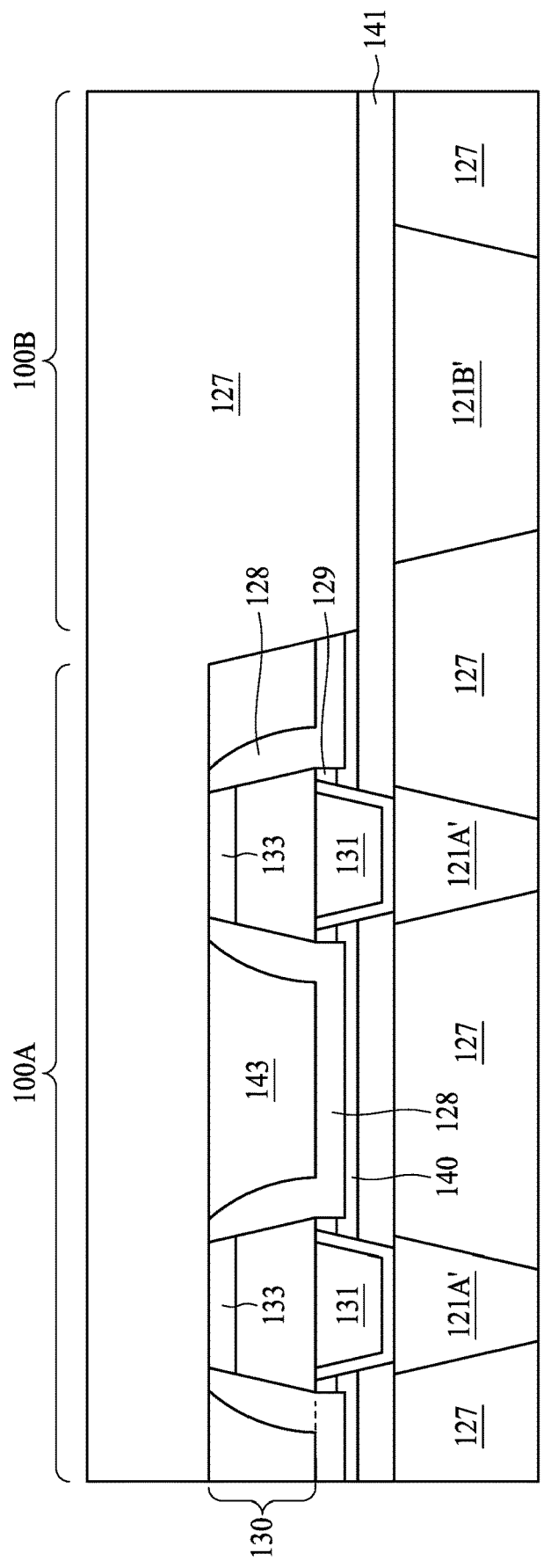

In FIG. 15, an inter-metal dielectrics (IMDs) 127 is formed above the dielectric layer 143, the top electrode 133, and the logic region 100B. The inter-metal dielectrics (IMDs) 127 may be formed of oxides such as un-doped Silicate Glass (USG), Fluorinated Silicate Glass (FSG), low-k dielectric materials, or the like. The low-k dielectric materials may have k values lower than 3.8, although the dielectric materials of IMDs 127 may also be close to 3.8. In some embodiments, the k values of the low-k dielectric materials are lower than about 3.0, and may be lower than about 2.5.

Figure 16:
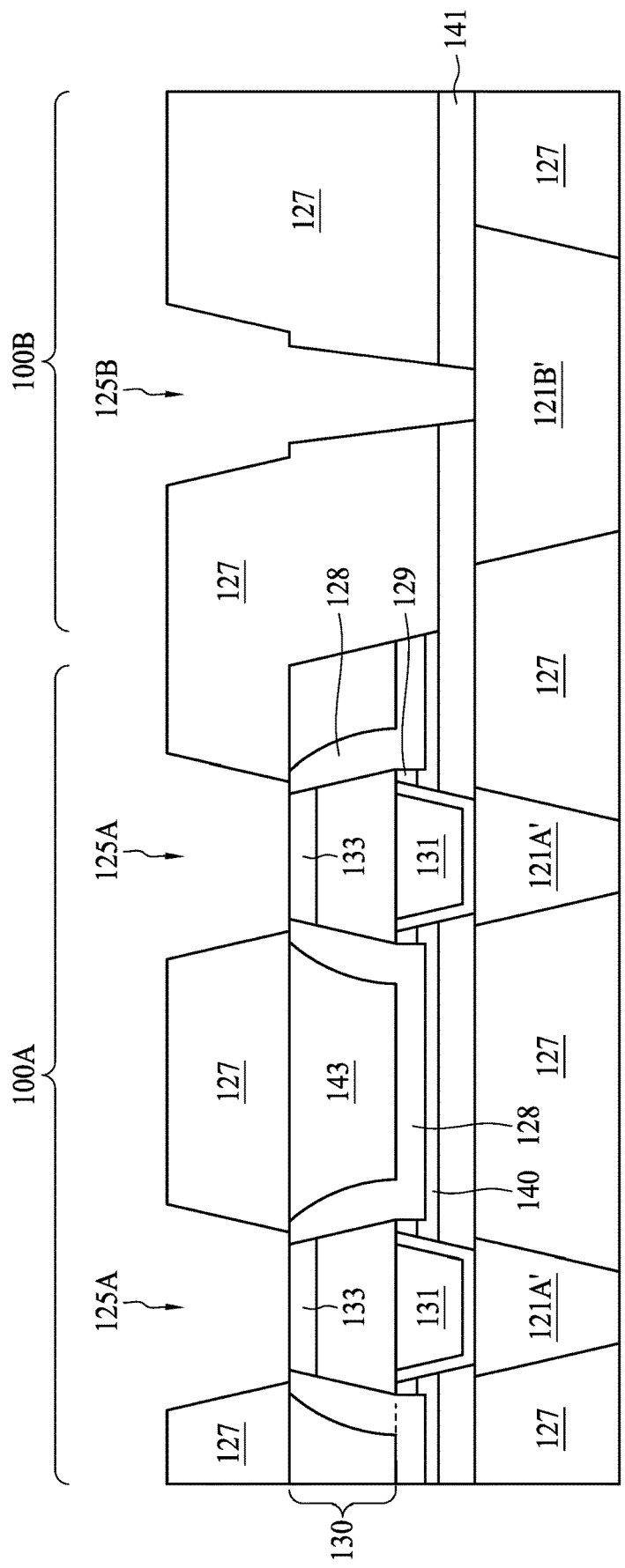

In FIG. 16, the $(N+M)^{th}$ metal layer trenches 125A within the memory region 100A are formed above the top electrode, and the $(N+M)^{th}$ metal layer trenches 125B within the logic region 100B are formed above the $N^{th}$ metal layer 121B'.

Figure 17:
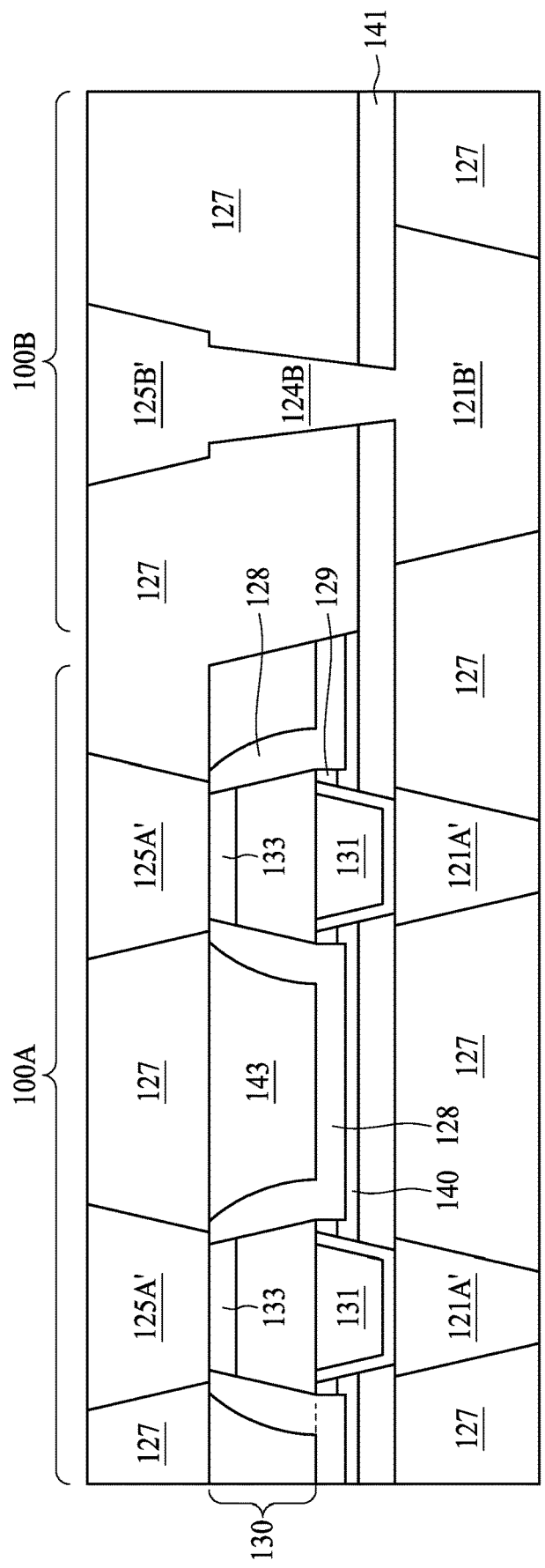

In FIG. 17, a conductive metal is filled into the metal layer trenches 125A and 125B, for example, a conventional Dual Damascene operation. The patterned trenches are filled with a conductive material by an electroplating operation, and excess portions of the conductive material are removed from the surface using a chemical mechanical polishing (CMP) operation, an etch operation, or combinations thereof. In some embodiments, the $(N+M)^{th}$ metal layers 125A' and 125B' may be formed from copper (Cu), W, AlCu, or the like. In some embodiments, $(N+M)^{th}$ metal layers 125A' and 125B' may be formed using the Damascene operation, which should be familiar to those in the art. First, trenches are etched through the dielectric material. This process can be performed by plasma etch operation, such as an Inductively Coupled Plasma (ICP) etch. A dielectric liner (not shown) then may be deposited on the sidewalls of the $(N+M)^{th}$ metal layer trenches 125A and 125B. In embodiments, the liner materials may include silicon oxide (SiOx) or silicon nitride (SiNx), which may be formed by plasma deposition process, such as physical vapor deposition (PVD) or chemical vapor deposition (CVD) including plasma enhanced chemical vapor deposition (PECVD). Next, a seed layer of Cu is plated in the trenches. Note the seed layer of Cu may be plated over a top surface of the top electrode or the hard mask 133. Then a layer of copper is deposited in the trenches 125A and 125B, followed by planarization of the copper layer, such as by chemical mechanical polishing (CMP), down to the top surface of a dielectric material. The exposed copper surface and dielectric material can be coplanar.

Some embodiments of the present disclosure provide a semiconductor structure including a logic region and a memory region adjacent to the logic region. The memory region includes a first $N^{th}$ metal line of an $N^{th}$ metal layer, a magnetic tunneling junction (MTJ) cell over the first $N^{th}$ metal line, a carbon-based layer between the first $N^{th}$ metal line and the MTJ cell, and a first $(N+1)^{th}$ metal via of an $(N+M)^{th}$ metal layer, the first $(N+M)^{th}$ metal via being disposed over the MTJ cell. N is an integer greater than or equal to 1, and M is an integer greater than or equal to 1.

Some embodiments of the present disclosure provide a method for manufacturing a semiconductor structure. The method includes (1) forming a first $N^{th}$ metal line, (2) forming a carbon-based layer over the first $N^{th}$ metal line, (3) forming a bottom electrode via in the carbon-based layer, (4) forming a magnetic tunneling junction (MTJ) multilayer over the bottom electrode via, (5) patterning a MTJ cell by an ion beam etch, and (6) forming a first $(N+M)^{th}$ metal via over the MTJ cell. N is an integer greater than or equal to 1, and M is an integer greater than or equal to 1.

Some embodiments of the present disclosure provide a method for manufacturing a semiconductor structure. The method includes (1) forming a first $N^{th}$ metal line in a memory region and a second $N^{th}$ metal line in a logic region, (2) forming a carbon-based layer over the first $N^{th}$ metal line and the second $N^{th}$ metal line, (3) forming a bottom electrode via in the carbon-based layer, (4) forming a magnetic tunneling junction (MTJ) multilayer over the bottom electrode via, (5) patterning a MTJ cell by an ion beam etch, and (6) forming a first $(N+M)^{th}$ metal via directly on the MTJ. N is an integer greater than or equal to 1, and M is an integer greater than or equal to 1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to

What is claimed is:

1. A semiconductor structure, comprising:
   a memory region;
   a logic region adjacent to the memory region;
   a first magnetic tunneling junction (MTJ) cell and a second MTJ cell over the memory region;
   a carbon-based layer over the memory region; and
   a bottom electrode via under the first MTJ cell, wherein an uppermost surface of the bottom electrode via is above an uppermost surface of the carbon-based layer;
   wherein a bottom portion of the bottom electrode via is free from being surrounded by the carbon-based layer.

2. The semiconductor structure of claim 1, wherein an entire bottom width of the first MTJ cell is greater than an entire top width of the bottom electrode via.

3. The semiconductor structure of claim 1, further comprising a sidewall spacer laterally surrounding the first MTJ cell.

4. The semiconductor structure of claim 3, wherein the sidewall spacer is in direct contact with a top portion of the bottom electrode via.

5. The semiconductor structure of claim 3, wherein a bottom surface of the sidewall spacer is below a bottom surface of the first MTJ cell.

6. The semiconductor structure of claim 1, wherein the logic region is free from being under a coverage of the carbon-based layer.

7. A semiconductor structure, comprising:
   a memory region adjacent to a logic region;
   a first metal line in the memory region;
   a bottom electrode via over the first metal line;
   a magnetic tunneling junction (MTJ) cell over the bottom electrode via; and
   a carbon-based layer laterally surrounding a middle portion of the bottom electrode via without surrounding the MTJ cell, wherein a bottom portion of the bottom electrode via is free from being surrounded by the carbon-based layer.

8. The semiconductor structure of claim 7, further comprising an oxide-containing layer laterally surrounding the bottom portion of the bottom electrode via.

9. The semiconductor structure of claim 7, further comprising:
   a sidewall spacer laterally surrounding a sidewall of the MTJ cell and a top portion of the bottom electrode via.

10. The semiconductor structure of claim 9, wherein the sidewall spacer is in direct contact with a sidewall of the MTJ cell and the top portion of the bottom electrode via.

11. The semiconductor structure of claim 7, further comprising:
    a second metal line, disposed over the MTJ cell.

12. The semiconductor structure of claim 11, wherein an entire top surface of the MTJ cell contacts a bottom surface of the second metal line, and an entire bottom surface of the bottom electrode via contacts a top surface of the first metal line.

13. A semiconductor structure, comprising:
    a memory region;
    a logic region adjacent to the memory region;
    a magnetic tunneling junction (MTJ) cell over the memory region;
    a carbon-based layer over the memory region; and
    a bottom electrode via under the MTJ cell, wherein a middle portion of the bottom electrode via is laterally surrounded by the carbon-based layer;
    wherein the bottom electrode via has a profile tapering away from the MTJ cell, and the MTJ cell is a profile tapering away from the bottom electrode via;
    wherein an entire bottom width of the first MTJ cell is greater than an entire top width of the bottom electrode via.

14. The semiconductor structure of claim 13, wherein an uppermost surface of the bottom electrode via is above an uppermost surface of the carbon-based layer.

15. The semiconductor structure of claim 13, wherein a bottom portion of the bottom electrode via is free from being surrounded by the carbon-based layer.

16. The semiconductor structure of claim 13, wherein the carbon-based layer is composed of carbon, amorphous carbon, or diamond.

17. The semiconductor structure of claim 13, further comprising a planarization etch stop layer over the carbon-based layer.

18. The semiconductor structure of claim 17, wherein the planarization etch stop layer is only under a coverage of a vertical projection area of the MTJ cell.

19. The semiconductor structure of claim 18, wherein a portion of the carbon-based layer under the planarization etch stop layer possesses a thickness greater than a thickness of a portion of the carbon-based layer away from or not shadowed by the planarization etch stop layer.

20. The semiconductor structure of claim 7, wherein the carbon-based layer comprises a first portion proximal to the MTJ cell and a second portion adjacent to the first portion, a thickness of the first portion is greater than a thickness of the second portion.

* * * * *